US009265152B2

(12) United States Patent
Pymento et al.

(10) Patent No.: US 9,265,152 B2
(45) Date of Patent: Feb. 16, 2016

(54) DUAL SIDE STAGGERED SURFACE MOUNT DUAL IN-LINE MEMORY MODULE

(71) Applicant: Lenovo Enterprise Solutions (Singapore) Pte. Ltd., Singapore (SG)

(72) Inventors: Larry G. Pymento, Cary, NC (US); Tony C. Sass, Fuquay Varina, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 79 days.

(21) Appl. No.: 14/108,943

(22) Filed: Dec. 17, 2013

(65) Prior Publication Data

US 2015/0173194 A1   Jun. 18, 2015

(51) Int. Cl.
| | |
|---|---|
| *H01L 23/02* | (2006.01) |
| *H05K 1/18* | (2006.01) |
| *H05K 3/30* | (2006.01) |
| *H05K 1/02* | (2006.01) |

(52) U.S. Cl.
CPC .............. *H05K 1/181* (2013.01); *H05K 1/0201* (2013.01); *H05K 3/303* (2013.01); *H05K 2201/09709* (2013.01); *H05K 2201/10159* (2013.01); *H05K 2201/10189* (2013.01); *H05K 2201/10545* (2013.01); *H05K 2201/10568* (2013.01); *Y10T 29/49133* (2015.01)

(58) Field of Classification Search
CPC .................. H05K 1/181; H05K 3/303; H05K 2201/10545
USPC ......................................................... 257/686
See application file for complete search history.

(56) References Cited

U.S. PATENT DOCUMENTS

| | | | | |
|---|---|---|---|---|
| 4,472,765 | A * | 9/1984 | Hughes ................ | H05K 7/1445 361/729 |
| 5,259,768 | A * | 11/1993 | Brunker et al. ................. | 439/60 |
| 5,895,278 | A * | 4/1999 | Humphrey ..................... | 439/101 |
| 6,095,872 | A * | 8/2000 | Lang et al. ................. | 439/733.1 |
| 6,163,464 | A * | 12/2000 | Ishibashi ................ | G06F 1/184 174/261 |
| 6,392,142 | B1 * | 5/2002 | Uzuka ...................... | H05K 1/14 174/541 |
| 6,819,129 | B2 * | 11/2004 | Kim et al. ................ | 324/756.02 |
| 7,303,640 | B2 | 12/2007 | Fei | |
| 7,632,127 | B2 * | 12/2009 | Beaman et al. ............... | 439/327 |
| 7,849,592 | B2 | 12/2010 | Brodsky et al. | |
| 8,419,447 | B2 | 4/2013 | Freedman | |
| 8,425,237 | B2 * | 4/2013 | Sass et al. ....................... | 439/62 |
| 8,438,515 | B2 | 5/2013 | Leddige et al. | |
| 8,866,023 | B2 * | 10/2014 | Kadri et al. .................... | 174/261 |

(Continued)

OTHER PUBLICATIONS

Huang et al., Warpage and Curvature Determination of PCB With DIMM Socket During Reflow Process by Strain Gage Measurement, Microsystems Packaging Assembly and Circuits Technology Conference (IMPACT), 2010 5th International, Oct. 20-22, 2010.

(Continued)

*Primary Examiner* — Luan C Thai
(74) *Attorney, Agent, or Firm* — Lieberman & Brandsdorfer, LLC

(57) ABSTRACT

Embodiments of the invention relates to a process and assembly for a dual sided and staggered connector arrangement on a substrate. Surface mount connector technology is employed to enable a flush connection of connector leads to the surface of the substrate. Retaining pins are provided with each connector and are sized to be received by the substrate, but not to extend through the substrate. The retaining pins are sized and configured to hold each connector in a set position, while mitigating interference with an opposing side of the PCB.

20 Claims, 9 Drawing Sheets

(56) References Cited

U.S. PATENT DOCUMENTS

| | | |
|---|---|---|
| 2007/0212943 A1 | 9/2007 | Sun |
| 2009/0051004 A1 | 2/2009 | Roth et al. |
| 2012/0175160 A1 | 7/2012 | Kadri et al. |
| 2012/0194992 A1 | 8/2012 | Bandholz et al. |
| 2012/0325540 A1 | 12/2012 | Li |
| 2013/0007356 A1 | 1/2013 | Liu et al. |
| 2013/0100746 A1 | 4/2013 | Rajan et al. |

OTHER PUBLICATIONS

Kollipara et al., Evaluation of a Module Based Memory System With an LCP Flex Interconnect, pp. 1200-1206, 2009 Electronics Components and Technology Conference, 2009.

* cited by examiner

DUAL SIDE STAGGERED SURFACE MOUNT DUAL IN-LINE MEMORY MODULE

BACKGROUND

The present invention relates to a design structure for mounting memory modules to a substrate. More specifically, the invention relates to a staggered dual sided mount of the memory modules to opposing sides of the substrate in a manner that increases density while mitigating interference.

Computer systems generally include a processing unit operably connected to a memory module, also referred to herein as memory. The memory module is in communication with a printed circuit board (PCB). Different forms of memory modules are known in the art including a single in-line memory module (SIMM) and a dual in-line memory module (DIMM). The DIMM is a double SIMM. Like a SIMM, the DIMM module contains one or more random access memory (RAM) chips on a PCB that connects to a computer motherboard.

Recent developments with memory packages such as the DIMM include mounting DIMMs on both sides of the PCB, or other substrate. This manner of mounting the DIMMs increases memory density. Signals routed through the substrate may connect to solder balls or connections to the DIMM on opposite sides of the packages.

BRIEF SUMMARY

The invention comprises an assembly and method for dual sided placement of connectors and associated memory modules on a substrate.

In one aspect, a printed circuit board assembly is provided to accommodate placement of memory module connectors. The printed circuit board (PCB) has a first side and an oppositely disposed second side. A first bank of first surface mount technology (SMT) dual in-line memory module (DIMM) connectors is mounted on the first side, with a plan view of the first bank defining a first footprint and a second bank of second SMT DIMM connectors is mounted on the second side, with a plan view of the second bank defining a second footprint having an outline that is different from the first footprint.

In another aspect, a method for assembling a printed circuit board is provided. A first bank of first surface mount technology (SMT) dual in-line memory module (DIMM) connectors is mounted on a first side of a printed circuit board (PCB), with a plan view of the first bank defining a first footprint. In addition, a second bank of second SMT DIMM connectors is mounted on a second side of the PCB, with a plan view of the second bank defining a second footprint having an outline that is different from the first footprint. The placement of the second SMT DIMM with respect to the first SMT DIMM is staggered to support separation of both thermal dissipation and wiring between the first side and the second side of the PCB.

Other features and advantages of this invention will become apparent from the following detailed description of the presently preferred embodiment(s) of the invention, taken in conjunction with the accompanying drawings.

BRIEF DESCRIPTION OF THE SEVERAL VIEWS OF THE DRAWINGS

The drawings referenced herein form a part of the specification. Features shown in the drawings are meant as illustrative of only some embodiments of the invention, and not of all embodiments of the invention unless otherwise explicitly indicated.

DETAILED DESCRIPTION

It will be readily understood that the components of the present invention, as generally described and illustrated in the Figures herein, may be arranged and designed in a wide variety of different configurations. Thus, the following detailed description of the embodiments of the apparatus, system, and method of the present invention, as presented in the Figures, is not intended to limit the scope of the invention, as claimed, but is merely representative of selected embodiments of the invention.

Reference throughout this specification to "a select embodiment," "one embodiment," or "an embodiment" means that a particular feature, structure, or characteristic described in connection with the embodiment is included in at least one embodiment of the present invention. Thus, appearances of the phrases "a select embodiment," "in one embodiment," or "in an embodiment" in various places throughout this specification are not necessarily referring to the same embodiment.

The illustrated embodiments of the invention will be best understood by reference to the drawings, wherein like parts are designated by like numerals throughout. The following description is intended only by way of example, and simply illustrates certain selected embodiments of devices, systems, and processes that are consistent with the invention as claimed herein.

Figure 1:
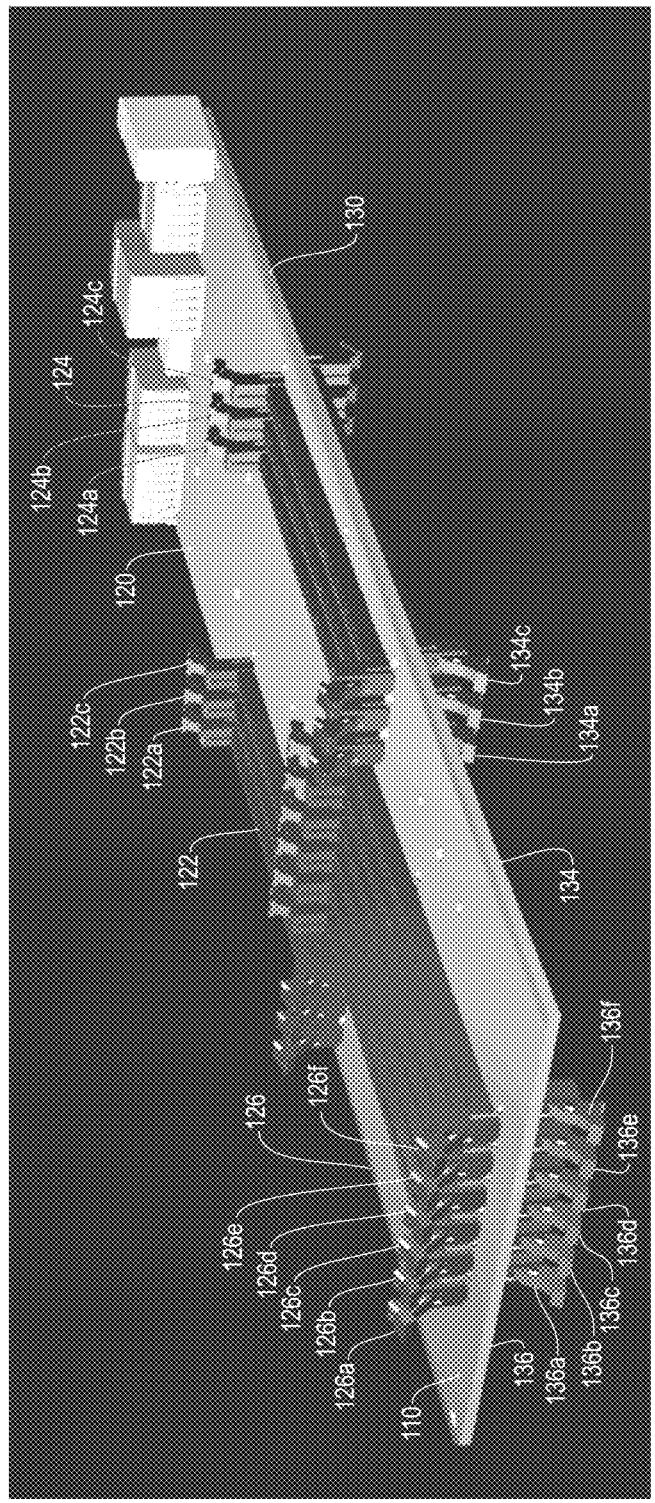
FIG. 1 depicts a substrate with dual sided placement of DIMM packages.

An assembly and method for creating a printed circuit board (PCB) or alternate substrate with an increased density of memory modules while mitigating interference is described in detail below. The assembly and method employs a topology wherein the DIMM packages are mounted on opposing sides of the substrate. To enable the novel assembly, surface mount technology (SMT) DIMM connectors are employed in place of through pin connectors. The SMT connectors mitigate interference of pins from a package mounted on an opposing substrate surface. Referring now to FIG. 1, a substrate (110) is shown with dual sided placement of DIMM packages. As shown, the substrate (110) includes a first side (120) and an oppositely disposed second side (130). In one embodiment, the first side (120) is also referred to herein as the top side. Similarly, in one embodiment, the second side (130) is also referred to herein as the bottom side. A plurality of first DIMM packages are mounted to the first side (120), and a plurality of second DIMM packages are mounted to the second side (130). Accordingly, the substrate (110) is configured to receive dual mounted DIMM packages on the two opposing sides (120) and (130), respectively.

The assembled DIMM packages form a staggered footprint on the substrate (110). The first side (120) of the substrate (110) is shown with three banks (122), (124), and (126) of DIMM packages. Each of the banks has two or more connectors to receive modules. In the example shown herein, the first bank (122) has three connectors (122a), (122b), and (122c), the second bank (124) has three connectors (124a), (124b), and (124c), and the third bank (126) has six connectors (126a), (126b), (126c), (126d), (126e), and (126f). Each of the connectors on each of the banks is aligned on the substrate. Specifically, the connectors (122a)-(122c) in the first bank (122) are aligned with each other, the connectors (124a)-(124c) in the second bank (124) are aligned with each other, and the connectors (126a)-(126f) in the third bank (126) are aligned with each other. In one embodiment, the first bank (122) is aligned with the second bank (124). Similarly, in one embodiment, the banks may be configured with a different quantity of connectors. The quantity of banks and the quantity of connectors in each of the respective banks shown herein is for illustrative purposes.

The second side (130) of the substrate (110) is also provided with a plurality of banks (132), (134), and (136) of DIMM packages. In the example shown herein, bank (132) has three connectors (not shown), bank (134) has three connectors (134a), (134b), and (134c), and bank (136) has six connectors (136a), (136b), (136c), (136d), (136e), and (136f). The connectors in each of the respective banks (132), (134), and (136) are aligned with each other. However, the banks on the first side (120) are not aligned with the banks on the second side (130).

Specifically, a staggered pattern is provided between the banks on each of the first and second sides (120) and (130), respectively, and the connectors therein. In one embodiment, the staggering includes a partial but not complete overlap of the banks on the first side (120) with the banks on the second side (130). In another embodiment, the staggering includes non-overlap of the banks on the first side (120) with the banks on the second side (130). Regardless of the form of staggering, the banks on the first side (120) are fixed to the first side of the substrate (110) and the banks on the second side (130) are fixed to the second side of the substrate (110).

Figure 2:
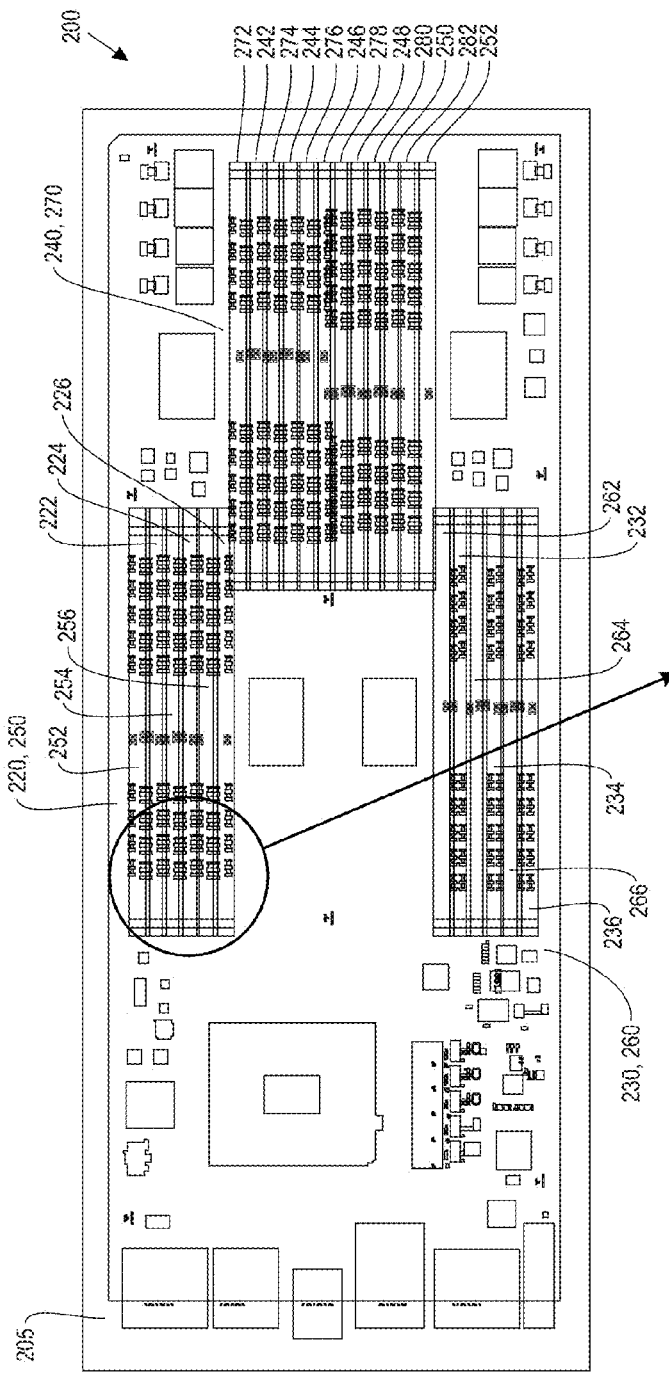
FIG. 2 depicts a schematic view of the substrate of FIG. 1 showing the connectors on both the first and second sides, and the staggered arrangement of the connectors.

The following description is specific to one embodiment of the banks and packages therein. Referring to FIG. 2, a schematic view of the substrate of FIG. 1 is provided from a first side perspective. In one embodiment, the first side is the top side. The substrate (210) is shown from the first side (205) with three banks (220), (230), and (240). Bank (220) is shown with three DIMM packages (222), (224) and (226). Bank (230) is shown with three DIMM packages (232), (234), and (236). Bank (240) is shown with six DIMM packages (242), (244), (246), (248), (250), and (252). A second side of the substrate (210) is not shown. However, assembly of the DIMM packages of the second side is shown in hidden lines viewed through the first side (205). The second side is shown with three banks of packages, including (250), (260), and (270). Bank (250) is shown with three DIMM packages (252), (254), and (256). Bank (260) is shown with three DIMM packages (262), (264), and (266). Bank (270) is shown with six packages (272), (274), (276), (278), (280), and (282). As shown, the DIMM modules on the first side (205) are staggered with respect to the banks on the second side. The staggering includes a partial but not complete overlap of bank (220) with bank (250), bank (230) with bank (260), and bank (240) with bank (270). The degree of overlap of the banks of the first side (205) with respect to the banks of the second side may vary, and as such is not limiting. The manner in which the banks of the first side (205) are mounted and staggered with respect to the banks of the second side creates a dual sided staggered pattern and increases memory density on the substrate (210).

Figure 3:
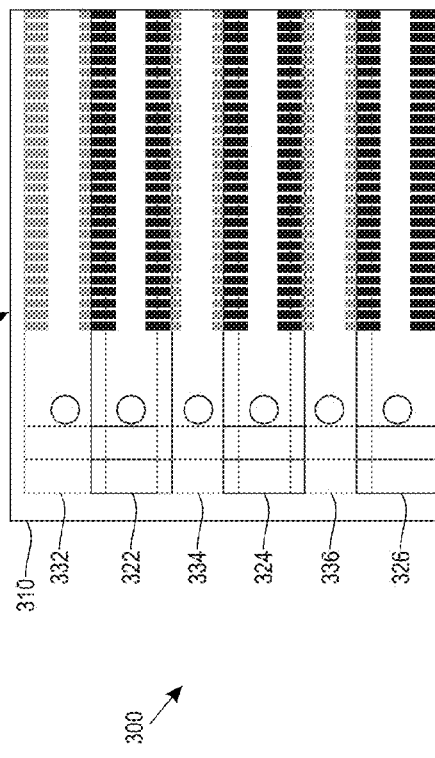
FIG. 3 is an enlarged schematic view of a portion of the substrate shown in FIG. 2 from a first side perspective.

Referring to FIG. 3, an enlarged schematic view (300) of a portion of the substrate (310) is provided from a first side perspective. In this enlargement, one of the banks of DIMM packages is shown. A total of six packages are shown with the alignment of the associated connectors. Three of the connectors (322), (324) and (326) are mounted on the top side of the substrate (310), and three of the connectors (332), (334) and (336) are mounted on the bottom side of the substrate (310). The alignment of the connectors on the top side is staggered with respect to alignment of the packages on the bottom side. The staggered pattern is an indication that the connectors and associated memory modules of the first side of the substrate are not aligned in their entirety with the packages, e.g. connectors and associated memory modules, of the second side of the substrate, in effect forming a partial alignment. In one embodiment, the packages of the first side are not aligned with the packages of the second side. The partial alignment, or in one embodiment non-alignment, allows for minimizing secondary re-flow effects and allows re-work. At the same time, the staggered pattern allows for a partial overlap of the packages on the top side with respect to the packages on the bottom side. The magnitude of stagger and partial overlap is designed based on wiring and signal integrity needed. In addition, with the staggered footprint, thermal dissipations between the first side and the second side are separated, leading to a reduced secondary re-flow.

As shown and described in FIGS. 1 and 2, each DIMM package is a surface mount device. In a surface mount device the through-hole technology construction method of fitting components with wire leads into holes in the substrate is replaced with an alternative lead construction. The wire leads, also referred to herein as pins, extend through the substrate and function as anchors until solder becomes solid and fixes the package to the substrate. In contrast to the pin configuration, the leads in the surface mount device may be in the form of a short pin, flat contact, or a matrix of solder balls (also referred to as a ball grid array). The surface mount device enables planar or near planar mounting of the device to the substrate.

Figure 4:
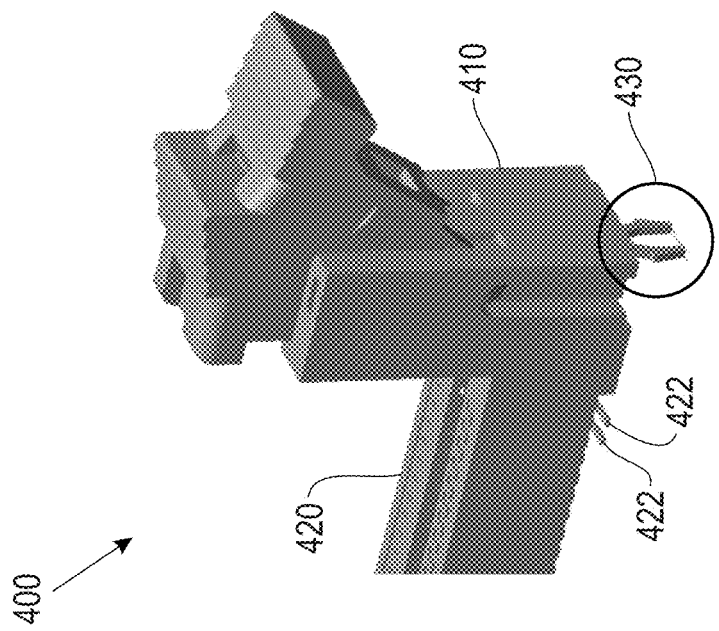
FIG. 4 is a perspective view of the connector.

Referring to FIG. 4 is a perspective view of a package connector (400). As shown, the connector has a body (410), with an elongated portion (420) to receive a card (not shown). A bottom surface of the elongated portion is shown with a plurality of surface mount leads (422). In one embodiment, the surface mount leads (422) are a set of solder leader that are soldered and fit on to pads in communication with the substrate. The leads (422) support electrical connection of the connector (400) to the substrate. However, the leads do not extend through the body of the substrate. In order to anchor the connector to the substrate, a set of connector pins (430) are provided in communication with a bottom surface of the connector (400). During assembly of the connector to the substrate, the pins (430) are received by an aperture in the substrate. In one embodiment, the aperture does not extend through the substrate, and as such pins are embedded in the substrate, e.g. the retention pins (430) have a length that is shorter than the thickness of the PCB.

Figure 5:
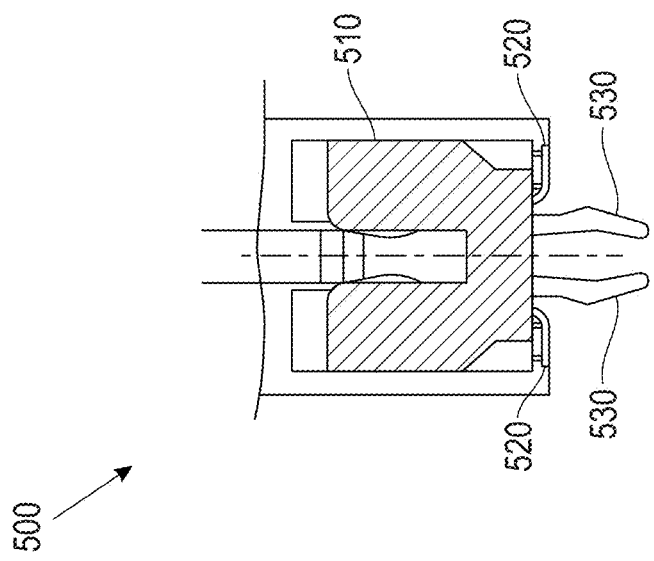
FIG. 5 is a cross sectional view of the connector.

Referring to FIG. 5, a cross section (500) of the connector is shown. The connector is provided with a body (510), and a set of leads (520) in communication with a bottom surface of the body. To mitigate interference with the leads (520), the set of retention pins (530) is spaced apart from the leads and extends into the body of the substrate. In one embodiment, the maximum length of the pins is 2.4 mm. Although only one set of retention pins is shown herein, in one embodiment, the package connector has two sets of pins, one placed in communication with a proximal end of the connector and a second set placed in communication with a distal end of the connector. Furthermore, in another embodiment a third set of pins is provided with the package connector and placed equidistant or near equidistant between the proximal and distal ends of the connector body. Accordingly, the retention pins mechanically attach the connector to the substrate without employing an electrical function.

Figure 6:
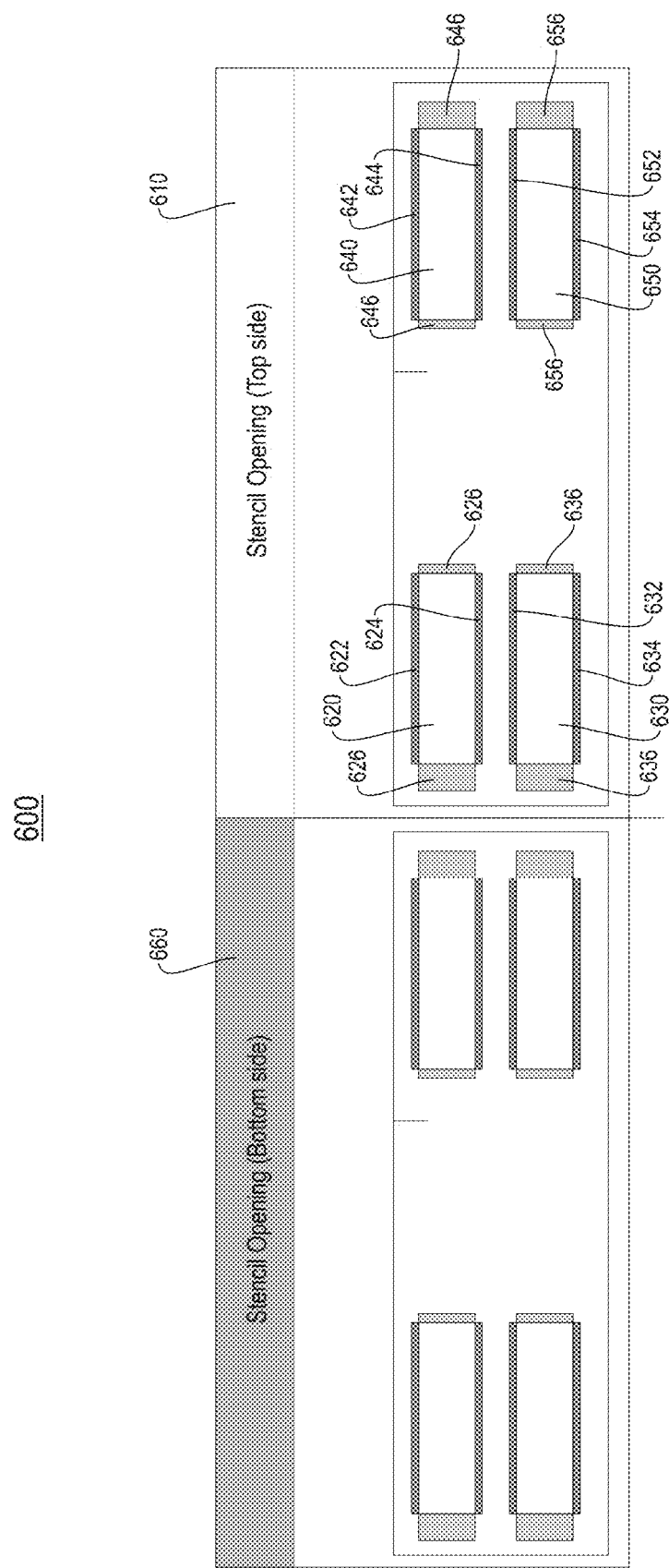
FIG. 6 depicts a block diagram of a top view of solder application on the first side of the substrate and on the second side of the substrate.

As described above, the leads in the package connector are surface mount leads. To accommodate dual mount of the package connectors on both sides of the substrate, a unique solder volume and pattern application is provided. FIG. 6 is a top view (600) of the application on the first side of the substrate (610), also referred to herein as the top side, and on the second side of the substrate (660), also referred to herein as the bottom side. As shown, there are four components (620), (630), (640), and (650) on the first side (610), including a copper pad associated with the lead, and a pattern for application of solder paste. Each component has an associated pattern. Specifically, component (620) has two areas (622) and (624) that correspond to the associated copper pad and a third area (626) that correspond to the pattern of the solder paste. Similarly, component (630) has two areas (632) and (634) that correspond to the associated copper pad and a third area (636) that correspond to the pattern of the solder paste, component (640) has two areas (642) and (644) that correspond to the associated copper pad and a third area (646) that correspond to the pattern of the solder paste, and component (650) has two areas (652) and (654) that correspond to the associated copper pad and a third area (656) that correspond to the pattern of the solder paste. As shown, the pattern of the solder paste differs from the surface area of the associated copper pad. Application of the solder is printed to a pattern that is different than the copper pad in order to increase the solder volume and compensate for the leads. The goal of the solder volume application is to mitigate defects. Short retention pins, e.g. pins that do not extend through the substrate body, allows for printing solder paste on both sides of the substrate without interference with a blade that spreads the solder paste to the side of the board.

The second side (660) of the substrate has a similar configuration and solder application as that shown on the first side (610). In one embodiment, the solder volume of the first side (610) of the substrate is ten percent larger than the solder volume of the second side of the substrate. The increase in the solder volume on the first side (610) compensates for connector co-planarity variations, connector and substrate warp during first and second side reflows, and also prevents shorts between neighboring pads and connections.

Figure 7A:
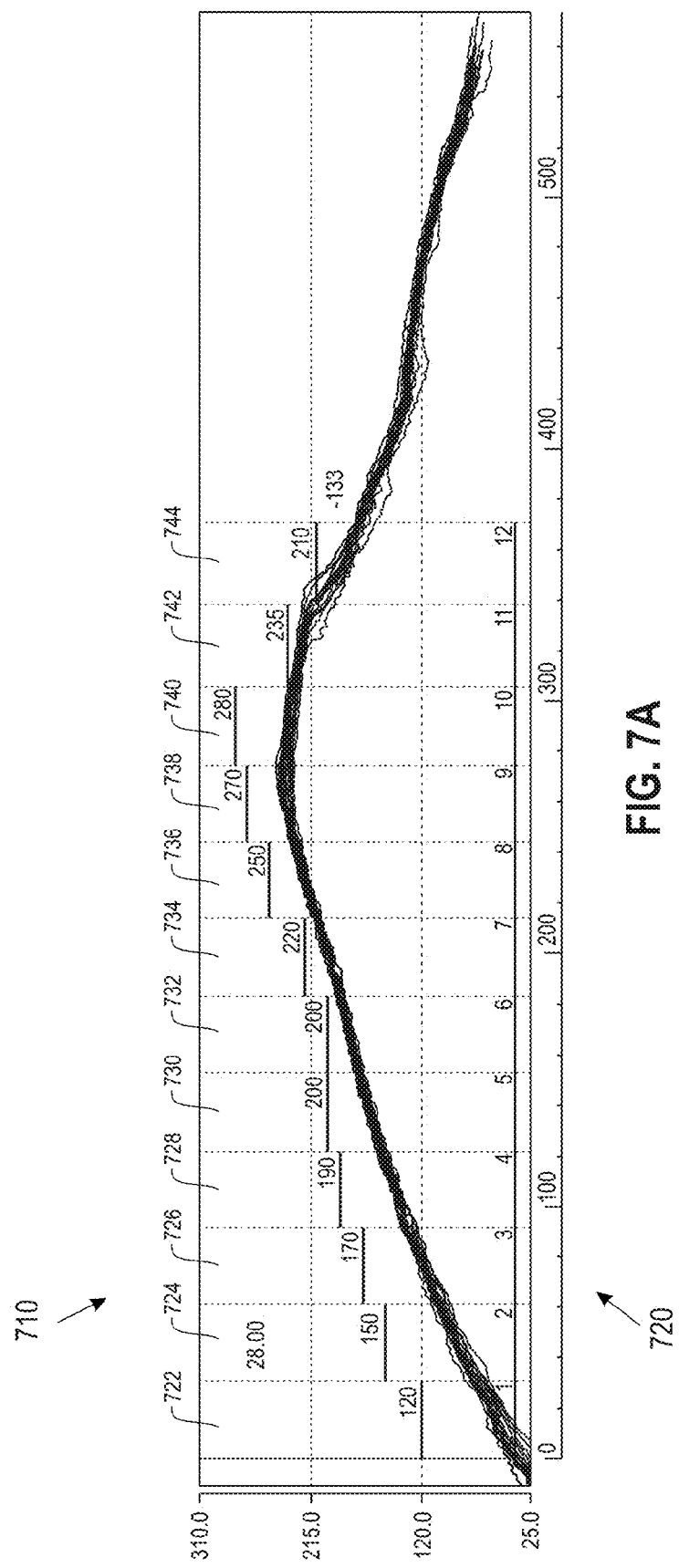
FIGS. 7A and 7B are graphs illustrating thermal profiles for processing the first and second sides, respectively, of the substrate.
Figure 7B:
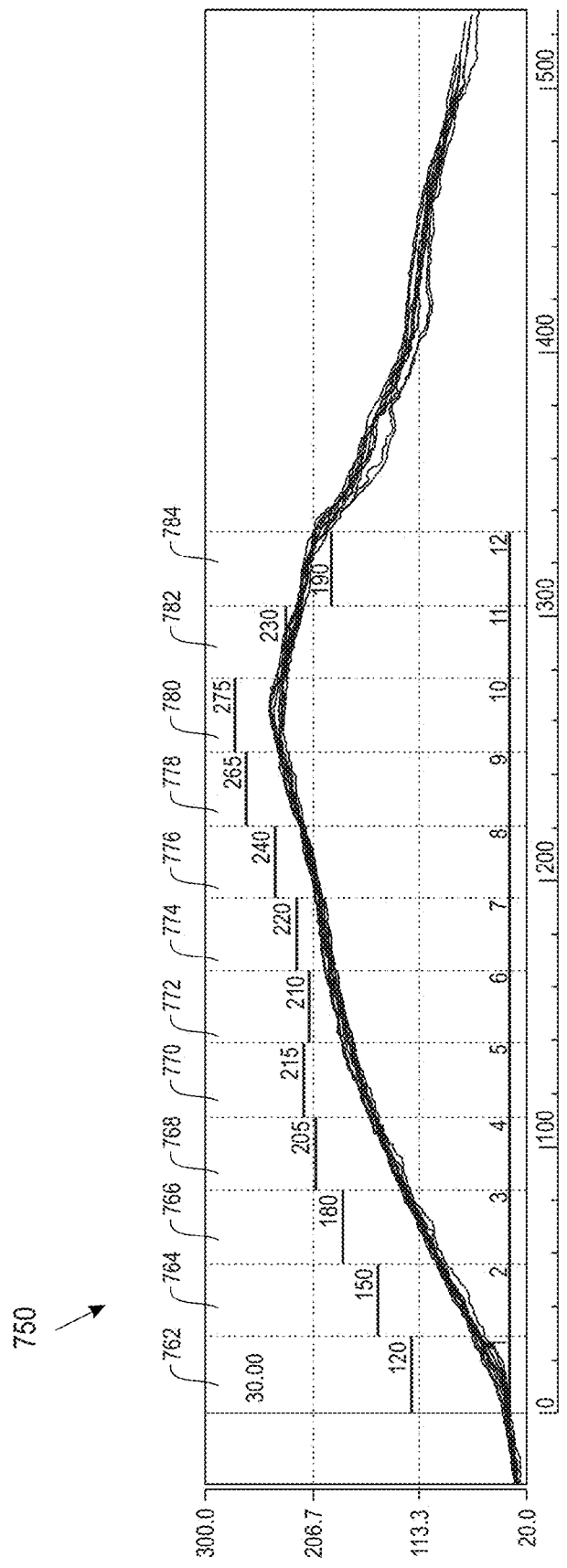

Referring to FIGS. 7A and 7B are graphs (700) and (750), respectively, illustrating thermal profile for processing the first and second sides, respectively, of the substrate. The Initially, the second side of the substrate is processed. In one embodiment, the first side of the substrate has a greater population, including items for cooling, such as a fan. Similarly, in one embodiment, the second side of the substrate is connected to an associated chassis. As shown in FIG. 7A, the thermal profile of the first side is shown with the vertical axis (710) representing temperature and the horizontal axis (720) representing time. The substrate is processed along a conveyor. In one embodiment, the conveyor for the first side operates at a speed of twenty eight inches per minute. The thermal profile for the first side has twelve zones (722), (724), (726), (728), (730), (732), (734), (736), (738), (740), (742), and (744), each of the zones having a different oven setting. As shown zones (736), (738) and (740) are the hottest temperature zones in the profile. In one embodiment, the solder joint changes forms between a liquid and a solid, and the oven settings in each zone support the solder joint formation and solidification with minimal defects.

Similarly, the thermal profile of the second side is shown in FIG. 7B, with the vertical axis (750) representing temperature and the horizontal axis (760) representing time. The substrate is processed along a conveyor. In one embodiment, the conveyor for the second side operates at a speed of thirty inches per minute. The thermal profile for the second side has twelve zones (762), (764), (766), (768), (770), (772), (774), (776), (778), (780), (782), and (784), each of the zones having a different oven setting. As shown zones (776), (778) and (780) are the hottest temperature zones in the profile, with the temperature settings in these zones being less than the hottest temperature zones for the thermal profile of the first size. Accordingly, the thermal profile for processing the first side is different from that of the second side in order to address thermal specificity and specifications unique to the different sides of the substrate.

Figure 8:
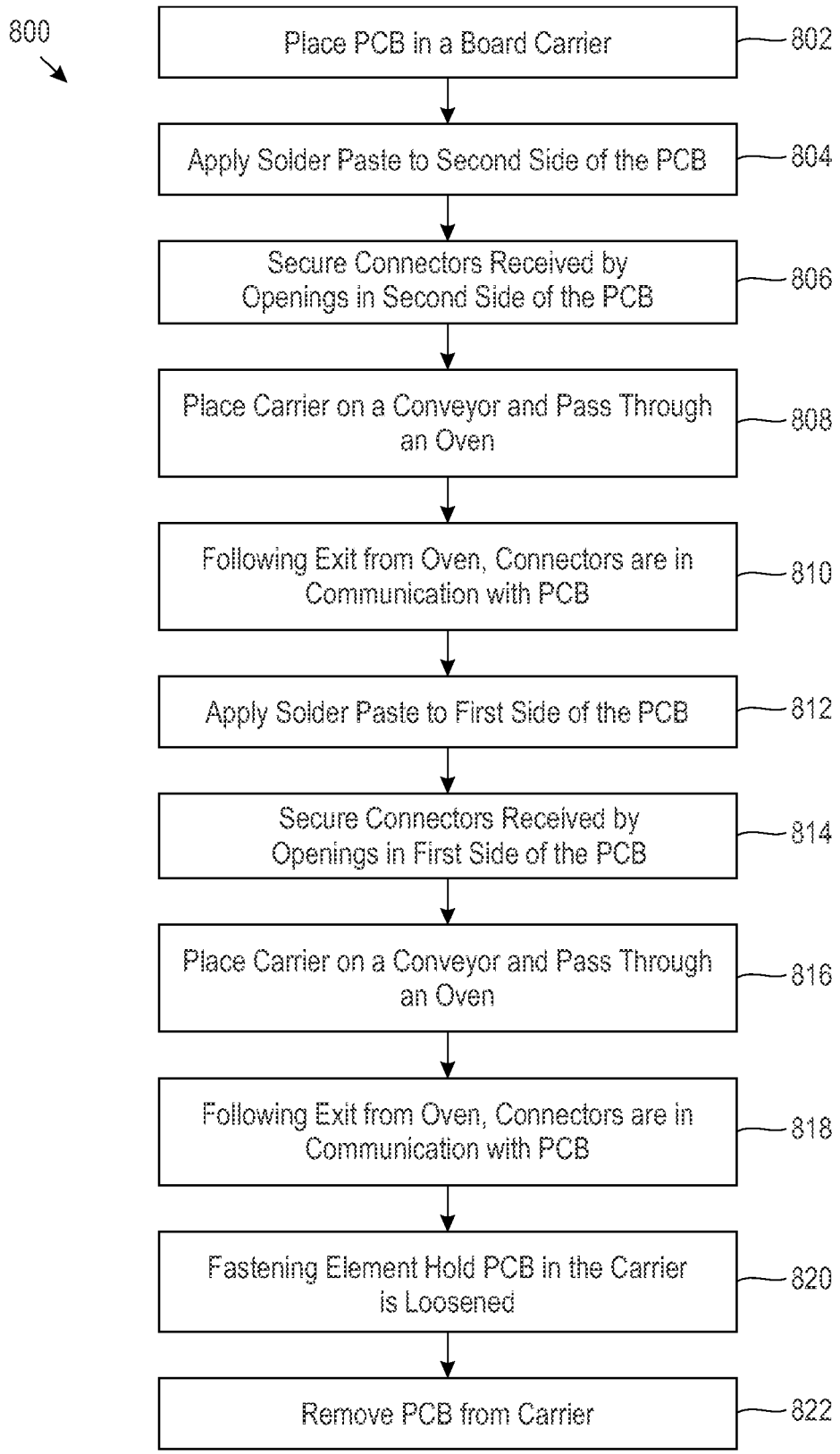
FIG. 8 depicts a flow chart illustrating assembly of the PCB employing two or more SMT DIMM connectors for mounting on opposing sides of the PCB.

Referring to FIG. 8, a flow chart (800) is provided to illustrate the general nature of assembly of the PCB employing two or more SMT DIMM connectors for mounting on opposing sides of the PCB. As shown, the PCB is placed in a board carrier (802). The carrier is configured with holding bars to provide support for SMT DIMM's at specific locations. In one embodiment, the holding bars are configured at unique locations to enable heat flows. Similarly, the position and width of the holding bars allow weight distribution and fit to minimize warp of the PCB. In one embodiment, the PCB is enclosed within the carrier board which is secured via a fastener. Solder paste is applied to the second side of the PCB (804). In one embodiment, the profile and volume of the solder paste is applied as demonstrated in FIG. 6. Following step (804), the SMT DIMM connectors are secured to the second side of the PCB (806). In one embodiment, the connector pins of each connector mate with the PCB and hold the connectors to the PCB until the solder solidifies. After all of the connectors are attached to the second side of the PCB, the carrier holding the PCB is placed on a conveyor and passed through an oven (808). The temperature settings on the oven vary based on time, as shown in FIGS. 7A and 7B, and the conveyor passes the PCB through the oven based on the thermal profile for the second side.

After the second side exits the oven, the solder solidifies and the connectors for the SMT DIMMs of the second side are secured and in communication with the PCB (810). The process of the second side is completed, and the process of assembling components of the first side is started. With respect to the first side, the PCB is already placed in the carrier. Solder paste is applied to the first side of the PCB (812). In one embodiment, the profile and volume of the solder paste is applied as demonstrated in FIG. 6. Following step (812), the SMT DIMM connectors are secured to the top side of the PCB (814). In one embodiment, the connector pins of each connector mate with the PCB and hold the connectors to the PCB until the solder solidifies. After all of the connectors are attached to the bottom side of the PCB, the carrier holding the PCB is placed on a conveyor and passed through the oven (816). The temperature settings on the oven vary based on time, as shown in FIGS. 7A and 7B, and the conveyor passes the PCB through the oven based on the thermal profile for the first side. It is understood that the second side passes through the oven a second time when the first side is passed through the oven. The thermal profile employed in passing the first side through the oven takes into account the assembly of the second side. The solder paste liquefies as the conveyor passed the PCB through the oven. Although the solder paste of the second side may loosen, the thermal profile ensures that the components of the second side remain in communication with the PCB.

After the carrier exits the oven, the solder paste on both the top and bottom sides of the PCT solidifies and the connection and communication of the connector components with the PCB is secured (818). The fastening element holding the PCB in the carrier is loosened (820) and the PCB is removed from the carrier (822). The carrier holds the PCB as it is placed through the oven two times, once for the bottom side components and once for the top side components. The carrier is configured to hold the PCB so that warping of the substrate is minimized, and secondary reflow on components is prevented. In one embodiment, one or more holding bars are provided on the carrier to support the connectors are specific locations to allow for required heat flows. At the same time, the carrier holding bars allow weight distribution. Accordingly, the carrier functions to maintain the PCB and components being fixed to the PCB in set positions to facilitate assembly of the PCB.

Figure 9:
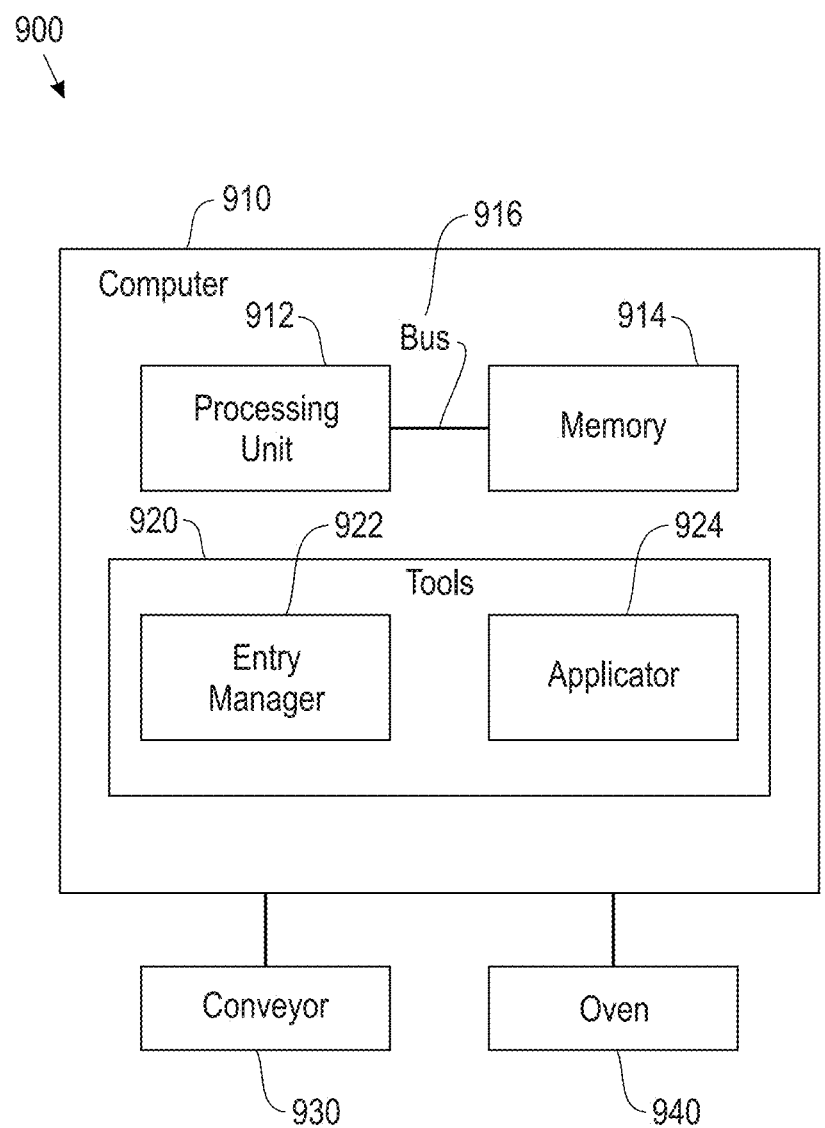
FIG. 9 depicts a system with a computer in communication with PCB and connector assembly tools.

The manner in which the PCB is assembled may be automated through a series of tools and associated computer readable and executable instructions. Referring to FIG. 9, a system is provided with a computer in communication with PCB and connector assembly tools. The computer (910) is provided with a processing unit (912) operably coupled to memory (914) across a bus (916). One or more tools (920) are shown to facilitate automated assembly of the PCB, including an entry manager (922) to place the PCB in the carrier, and an applicator (924) to apply solder paste to the board and to attach the connector to the appropriate location on the board. A conveyor (930) is provided in communication with the processing unit and the associated tools, and receives the carrier and places the carrier with the PCB therein through an oven (940). In one embodiment, one or more computer readable instructions are processed to convey the carrier through the oven based on the set thermal profile for the respective side of the PCB.

The tools shown in FIG. 9 may be implemented in programmable hardware devices such as field programmable gate arrays, programmable array logic, programmable logic devices, or the like. The tool may also be implemented in software for execution by various types of processors. An identified functional unit of executable code may, for instance, comprise one or more physical or logical blocks of computer instructions which may, for instance, be organized as an object, procedure, function, or other construct. Nevertheless, the executable of the tool need not be physically located together, but may comprise disparate instructions stored in different locations which, when joined logically together, comprise the tool and achieve the stated purpose of the tool.

Indeed, executable code could be a single instruction, or many instructions, and may even be distributed over several different code segments, among different applications, and across several memory devices. Similarly, operational data may be identified and illustrated herein within the tool, and may be embodied in any suitable form and organized within any suitable type of data structure. The operational data may be collected as a single data set, or may be distributed over different locations including over different storage devices, and may exist, at least partially, as electronic signals on a system or network.

Furthermore, the described features, structures, or characteristics may be combined in any suitable manner in one or more embodiments. In the following description, numerous specific details are provided, such as examples of agents, to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Figure 10:
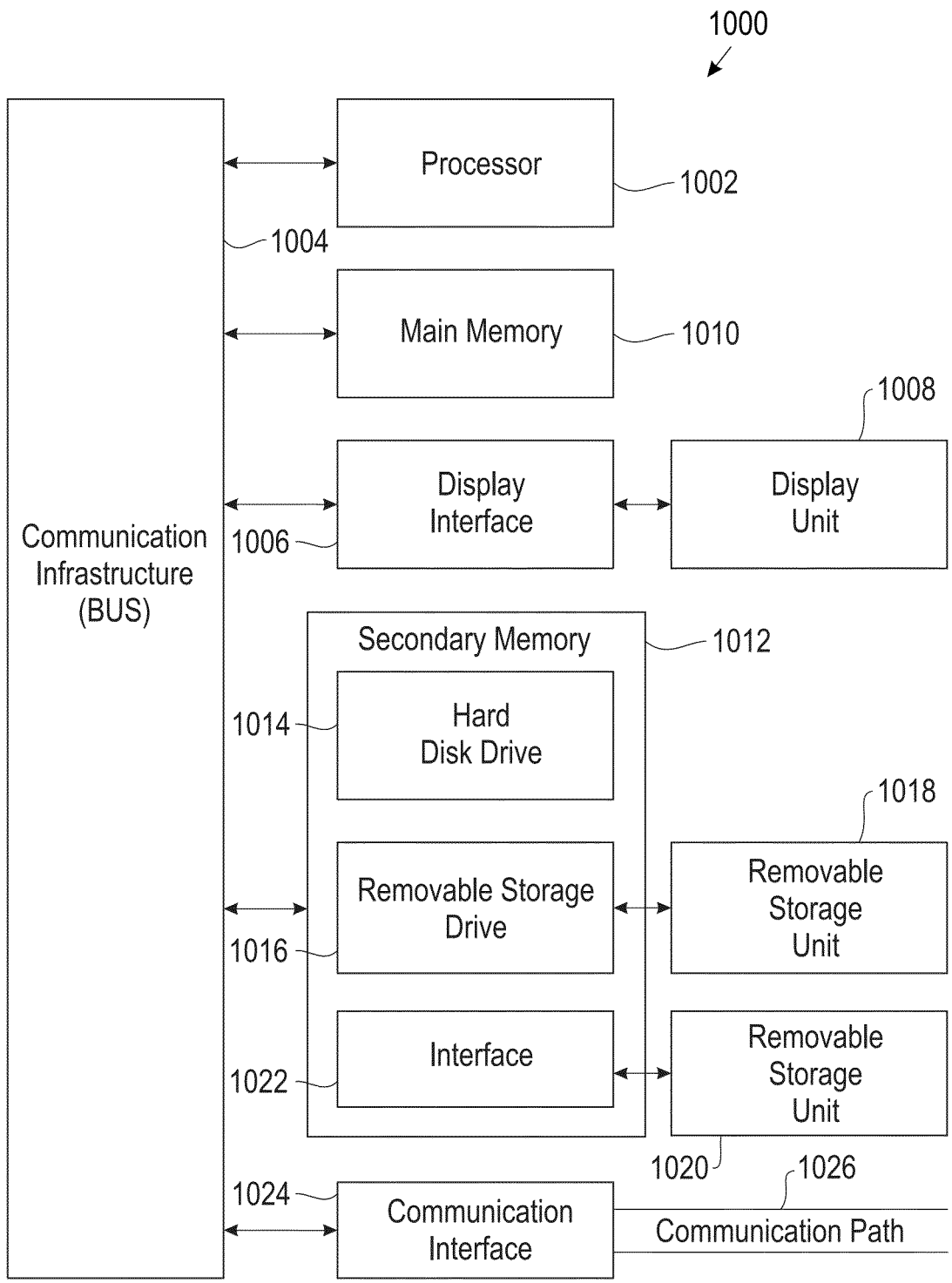
FIG. 10 depicts a block diagram of a computing environment according to an embodiment of the present invention.

Referring now to the block diagram of FIG. 10, additional details are now described with respect to implementing an embodiment of the present invention. The computer system includes one or more processors, such as a processor (1002). The processor (1002) is connected to a communication infrastructure (1004) (e.g., a communications bus, cross-over bar, or network).

The computer system can include a display interface (1006) that forwards graphics, text, and other data from the communication infrastructure (1004) (or from a frame buffer not shown) for display on a display unit (1008). The computer system also includes a main memory (1010), preferably random access memory (RAM), and may also include a secondary memory (1012). The secondary memory (1012) may include, for example, a hard disk drive (1014) and/or a removable storage drive (1016), representing, for example, a floppy disk drive, a magnetic tape drive, or an optical disk drive. The removable storage drive (1016) reads from and/or writes to a removable storage unit (1018) in a manner well known to those having ordinary skill in the art. Removable storage unit (1018) represents, for example, a floppy disk, a compact disc, a magnetic tape, or an optical disk, etc., which is read by and written to by removable storage drive (1016). As will be appreciated, the removable storage unit (1018) includes a computer readable medium having stored therein computer software and/or data.

In alternative embodiments, the secondary memory (1012) may include other similar means for allowing computer programs or other instructions to be loaded into the computer system. Such means may include, for example, a removable storage unit (1020) and an interface (1022). Examples of such means may include a program package and package interface (such as that found in video game devices), a removable memory chip (such as an EPROM, or PROM) and associated socket, and other removable storage units (1020) and interfaces (1022) which allow software and data to be transferred from the removable storage unit (1020) to the computer system.

The computer system may also include a communications interface (1024). Communications interface (1024) allows software and data to be transferred between the computer system and external devices. Examples of communications interface (1024) may include a modem, a network interface (such as an Ethernet card), a communications port, or a PCMCIA slot and card, etc. Software and data transferred via communications interface (1024) is in the form of signals which may be, for example, electronic, electromagnetic, optical, or other signals capable of being received by communications interface (1024). These signals are provided to communications interface (1024) via a communications path (i.e., channel) (1026). This communications path (1026) carries signals and may be implemented using wire or cable, fiber optics, a phone line, a cellular phone link, a radio frequency (RF) link, and/or other communication channels.

In this document, the terms "computer program medium," "computer usable medium," and "computer readable medium" are used to generally refer to media such as main memory (1010) and secondary memory (1012), removable storage drive (1016), and a hard disk installed in hard disk drive (1014).

Computer programs (also called computer control logic) are stored in main memory (1010) and/or secondary memory (1012). Computer programs may also be received via a communication interface (1024). Such computer programs, when run, enable the computer system to perform the features of the present invention as discussed herein. In particular, the computer programs, when run, enable the processor (1002) to perform the features of the computer system. Accordingly, such computer programs represent controllers of the computer system.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider.

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block(s).

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowcharts and block diagrams in the Figures illustrate the architecture, functionality, and operation of possible implementations of systems, methods and computer program products according to various embodiments of the present invention. In this regard, each block in the flowcharts or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. Accordingly, the staggered connector assembly enables and supports a dual sided and staggered surface mount connector arrangement on a substrate, while mitigating interference with an opposing side of the PCB.

Alternative Embodiment

It will be appreciated that, although specific embodiments of the invention have been described herein for purposes of illustration, various modifications may be made without departing from the spirit and scope of the invention. Accordingly, the scope of protection of this invention is limited only by the following claims and their equivalents.

We claim:

1. A printed circuit board (PCB) assembly, comprising:
a PCB having a first side and an oppositely disposed second side, wherein the PCB has a thickness defined by a normal distance from the first side to the second side;
a first set of banks mounted to the first side, the first set comprising a first bank of two or more first surface mount technology (SMT) dual in-line memory module (DIMM) connectors, and a third bank of two or more third SMT DIMM connectors, wherein a plan view of the first bank defines a first footprint; and
a second bank of second SMT DIMM connectors mounted to the second side, wherein a plan view of the second bank defines a second footprint having an outline that is different from the first footprint.

2. The PCB assembly of claim 1, wherein the first SMT DIMM connectors are aligned within the first bank, and wherein the second SMT DIMM connectors are aligned within the second bank.

3. The PCB assembly of claim 1, wherein each DIMM connector comprises a plurality of surface mount leads, wherein the leads do not extend through the thickness of the PCB, and wherein the leads are in a form selected from the group consisting of: short pin, flat contact, and ball grid array.

4. The PCB assembly of claim 1, further comprising a first retention pin in communication with each first SMT DIMM connector, the first retention pin to mount each first SMT DIMM connector to the first side, wherein the first retention pin is embedded within a portion of the thickness of the PCB upon mounting.

5. The PCB assembly of claim 4, further comprising a second retention pin in communication with each second DIMM connector, the second retention pin to mount each second DIMM connector to the second side of the PCB, wherein the second retention pin is embedded within a portion of the thickness of the PCB upon mounting.

6. The PCB assembly of claim 5, wherein the first retention pin has a length that is shorter than the thickness of the PCB to mitigate interference with the second SMT DIMM connectors, and wherein the second retention pin has a length that is shorter than the thickness of the PCB to mitigate interference with the first SMT DIMM connectors.

7. The PCB assembly of claim 1, wherein the mounting of the first and second banks creates a dual sided staggered pattern.

8. The PCB assembly of claim 7, wherein the dual sided staggered pattern is selected from the group consisting of: non-overlap and partial overlap.

9. The PCB assembly of claim 1, further comprising
a fourth bank of fourth SMT DIMM connectors mounted to the second side, wherein a plan view of the fourth bank defines a fourth footprint having an outline that is different from a third footprint defined by the third footprint.

10. The PCB assembly of claim 9, wherein the third SMT DIMM connectors are aligned within the third bank, and wherein the fourth SMT DIMM connectors are aligned within the fourth bank.

11. A method for assembling a printed circuit board (PCB), comprising:
mounting a first set of banks to a first side of a PCB, the first set comprising a first bank of two or more first surface mount technology (SMT) dual in-line memory module (DIMM) connectors, and a third bank of two or more third SMT DIMM connectors, wherein a plan view of the first bank defines a first footprint; and
mounting second bank of second DIMM connectors to a second side of the PCB, wherein a plan view of the second bank defines a second footprint having an outline that is different from the first footprint.

12. The method of claim 11, wherein the first SMT DIMM connectors are aligned within the first bank, and wherein the second SMT DIMM connectors are aligned within the second bank.

13. The method of claim 11, further comprising positioning a first pad in communication with the first bank, and forming an electrical connection between the first pad and an electrical trace on the first side of the PCB.

14. The method of claim 13, further comprising positioning a second pad in communication with the second bank, and forming an electrical connection between the second pad and an electrical trace on the second side of the PCB.

15. The method of claim 14, wherein each DIMM connector comprises a plurality of surface mount leads in communication with the pads, wherein the leads do not extend through the thickness of the PCB, and wherein the leads are in a form selected from the group consisting of: short pin, flat contact, and ball grid array.

16. The method of claim 11, wherein each first SMT DIMM connector is in communication with a first retention pin to mount each first SMT DIMM connector to the first side, wherein mounting includes embedding the first retention pin within a portion of a thickness defined by a distance from the first side to the second side of the PCB, and wherein the first retention pin has a length that is shorter than the thickness of the PCB to mitigate interference with the second SMT DIMM connectors.

17. The method of claim 16, wherein each second SMT DIMM connector is in communication with a second retention pin to mount each second SMT DIMM connector to the second side, wherein mounting includes embedding the second retention pin within a portion of the thickness of the PCB, and wherein the second retention pin has a length that is shorter than the thickness of the PCB to mitigate interference with the first SMT DIMM connectors.

18. The method of claim 11, wherein the mounting of the first and second banks creates a dual sided staggered pattern.

19. The method of claim 11,
mounting a fourth bank of fourth SMT DIMM connectors to the second side, wherein a plan view of the fourth bank defines a fourth footprint having an outline that is different from the third footprint, wherein the third SMT DIMM connectors are aligned within the third bank, and wherein the fourth SMT DIMM connectors are aligned within the fourth bank.

20. The PCB assembly of claim 1, wherein the first SMT DIMM connectors and the third SMT DIMM connectors are mounted parallel to the second SMT DIMM connectors.

* * * * *